(12) United States Patent
Wang et al.

(10) Patent No.: US 11,769,725 B2
(45) Date of Patent: Sep. 26, 2023

(54) INTEGRATED CIRCUIT DEVICE AND FORMATION METHOD THEREOF

(71) Applicant: CHANGXIN MEMORY TECHNOLOGIES, INC., Hefei (CN)

(72) Inventors: Mengmeng Wang, Hefei (CN); Hsin-Pin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 238 days.

(21) Appl. No.: 17/388,145

(22) Filed: Jul. 29, 2021

(65) Prior Publication Data

US 2022/0139829 A1    May 5, 2022

Related U.S. Application Data

(63) Continuation of application No. PCT/CN2021/095834, filed on May 25, 2021.

(30) Foreign Application Priority Data

Nov. 5, 2020   (CN) .......................... 202011221558.4

(51) Int. Cl.
*H01L 23/525*    (2006.01)
*H01L 23/522*    (2006.01)
(Continued)

(52) U.S. Cl.
CPC ................. *H01L 23/5256* (2013.01)

(58) Field of Classification Search
CPC ............ H01L 23/5256; H01L 23/5226; H01L 23/53295; H01L 23/5258; H01L 23/5223;
(Continued)

(56) References Cited

U.S. PATENT DOCUMENTS 6,440,833 B1    8/2002 Lee et al.
10,651,380 B1 *   5/2020 Hsieh .................. H10N 70/023
(Continued)

FOREIGN PATENT DOCUMENTS

CN    1239820 A    12/1999
CN    1469466 A    1/2004
(Continued)

OTHER PUBLICATIONS

ISR for International Application No. PCTCN2021095834 dated Aug. 11, 2021.

*Primary Examiner* — Omar F Mojaddedi
(74) *Attorney, Agent, or Firm* — Ladas & Parry LLP

(57) ABSTRACT

Disclosed are an integrated circuit device and a formation method thereof. The formation method of an integrated circuit device comprises the following steps: providing a substrate, wherein a first plug and a second plug are disposed inside the substrate; forming a first covering layer covering the substrate; forming, in the first region, a first opening exposing the first plug; forming a first conductive layer in the first opening; forming an isolation layer covering the first conductive layer and the first covering layer; forming, in the first region, a contact hole exposing the first conductive layer and a trench located above the contact hole and connecting with the contact hole, and forming, in the second region, a second opening exposing the second plug; and forming a conductive connection layer in the contact hole, forming a second conductive layer in the trench, and forming a fuse wire in the second opening.

14 Claims, 7 Drawing Sheets

(51) Int. Cl.
  *H01L 23/532* (2006.01)
  *H01L 21/768* (2006.01)
  *H01L 21/311* (2006.01)
  *H01L 21/02* (2006.01)

(58) Field of Classification Search
  CPC ... H01L 23/53228; H01L 24/02; H01L 24/03; H01L 24/05; H01L 21/31111; H01L 21/76807; H01L 21/76816; H01L 21/76814; H01L 21/76832; H01L 21/02063; H01L 21/02052
  See application file for complete search history.

(56) References Cited

U.S. PATENT DOCUMENTS

| | | | | |
|---|---|---|---|---|
| 2004/0171263 | A1* | 9/2004 | Choi | H01L 23/5258 257/E23.15 |
| 2006/0046465 | A1* | 3/2006 | Shim | H01L 21/02063 257/E21.228 |
| 2006/0141759 | A1 | 6/2006 | Kim | |
| 2009/0149013 | A1* | 6/2009 | Daubenspeck | H01L 23/585 438/601 |
| 2013/0193552 | A1* | 8/2013 | Ahn | H01L 23/5258 257/529 |
| 2013/0292836 | A1* | 11/2013 | Tang | H01L 21/76838 257/773 |
| 2016/0268336 | A1* | 9/2016 | Shum | H10N 50/01 |
| 2017/0213786 | A1* | 7/2017 | Ahn | H01L 23/4821 |

FOREIGN PATENT DOCUMENTS

| | | |
|---|---|---|
| CN | 101436539 A | 5/2009 |
| CN | 109427736 A | 3/2019 |

\* cited by examiner

INTEGRATED CIRCUIT DEVICE AND FORMATION METHOD THEREOF

CROSS-REFERENCE TO RELATED APPLICATIONS

This application is a continuation of International Patent Application No. PCT/CN2021/095834, filed on May 25, 2021, which claims priority to Chinese Patent Application No. 202011221558.4, filed on Nov. 5, 2020. The above-referenced applications are incorporated herein by reference in their entirety.

TECHNICAL FIELD

This application relates to the technical field of semiconductor production and in particular to an integrated circuit device and a formation method thereof.

BACKGROUND

A fuse wire is a resistive structure in an integrated circuit device. In an integrated circuit device, the fuse wire is blown to achieve the purpose of adjusting internal electrical functions or electrical parameters of an integrated circuit. In an integrated circuit device with a double-layer Damascus structure, a first metal layer, a second metal layer, and a metal connection layer located between the first metal layer and the second metal layer are commonly used together as a fuse wire. The structure of such a fuse wire can effectively avoid an overprinting offset problem caused by corrosion to an alignment mark.

However, due to the complex structure and cumbersome production process of the fuse wire, a larger fusing energy is required in a subsequent fusing process of the fuse wire, and a phenomenon of incomplete fusing often occurs, which leads to difficult control of process parameters and waste of fusing energy, thereby indirectly increasing the production cost of the integrated circuit device.

Therefore, how to simplify the structure of the fuse wire in the integrated circuit device and reduce the fusing energy of the fuse wire is a technical problem to be solved urgently.

SUMMARY

An objective of this application is to provide an integrated circuit device and a formation method thereof to solve the problem of complicated fuse wire structure and cumbersome production process in an existing fuse wire, and reduce the fusing energy of a fuse wire, thereby improving the process yield of integrated circuit devices and reducing production costs.

An embodiment of this application provides a formation method of an integrated circuit device, including the following steps:

providing a substrate, wherein the substrate includes a first region and a second region located outside the first region, and a first plug located in the first region and a second plug located in the second region are disposed inside the substrate;

forming a first covering layer covering the substrate;

etching the first covering layer to form, in the first region, a first opening exposing the first plug;

forming a first conductive layer in the first opening;

forming an isolation layer covering the first conductive layer and the first covering layer;

forming, in the first region, a contact hole exposing the first conductive layer and a trench located above the contact hole and connecting with the contact hole, and forming, in the second region, a second opening exposing the second plug; and forming a conductive connection layer in the contact hole, forming a second conductive layer in the trench, and forming a fuse wire in the second opening.

An embodiment of this application further provides an integrated circuit device, including:

a substrate, wherein the substrate includes a first region and a second region located outside the first region, wherein a first plug located in the first region and a second plug located in the second region are disposed inside the substrate, and a surface of the substrate is provided with a first covering layer and an isolation layer on a surface of the first covering layer;

a first conductive layer located in the first covering layer in the first region and electrically connected to the first plug;

a conductive connection layer located on a surface of the first conductive layer;

a second conductive layer located on a surface of the conductive connection layer, wherein one end of the conductive connection layer is electrically connected to the first conductive layer, and the other end of the conductive connection layer is electrically connected to the second conductive layer; and a fuse wire, located in the second region, wherein the fuse wire is of a solid columnar structure and penetrates the isolation layer and the first covering layer, a bottom surface of the fuse wire is electrically connected to the second plug, and a top surface of the fuse wire is flush with a top surface of the second conductive layer.

BRIEF DESCRIPTION OF THE DRAWINGS

Through the following description of the embodiments of the present invention with reference to the accompanying drawings, the above and other objectives, features and advantages of the present invention will be clearer. In the accompanying drawings.

DETAILED DESCRIPTION

In order to make the objectives, technical solutions and advantages of the present invention more clear, the following further describes the present invention in detail in conjunction with specific embodiments and with reference to the accompanying drawings. However, it should be understood that these descriptions are only exemplary, but not intended to limit the scope of the present invention. In addition, in the following description, descriptions of well-known structures and technologies are omitted to avoid unnecessarily obscuring the concept of the present invention.

Figure 1:
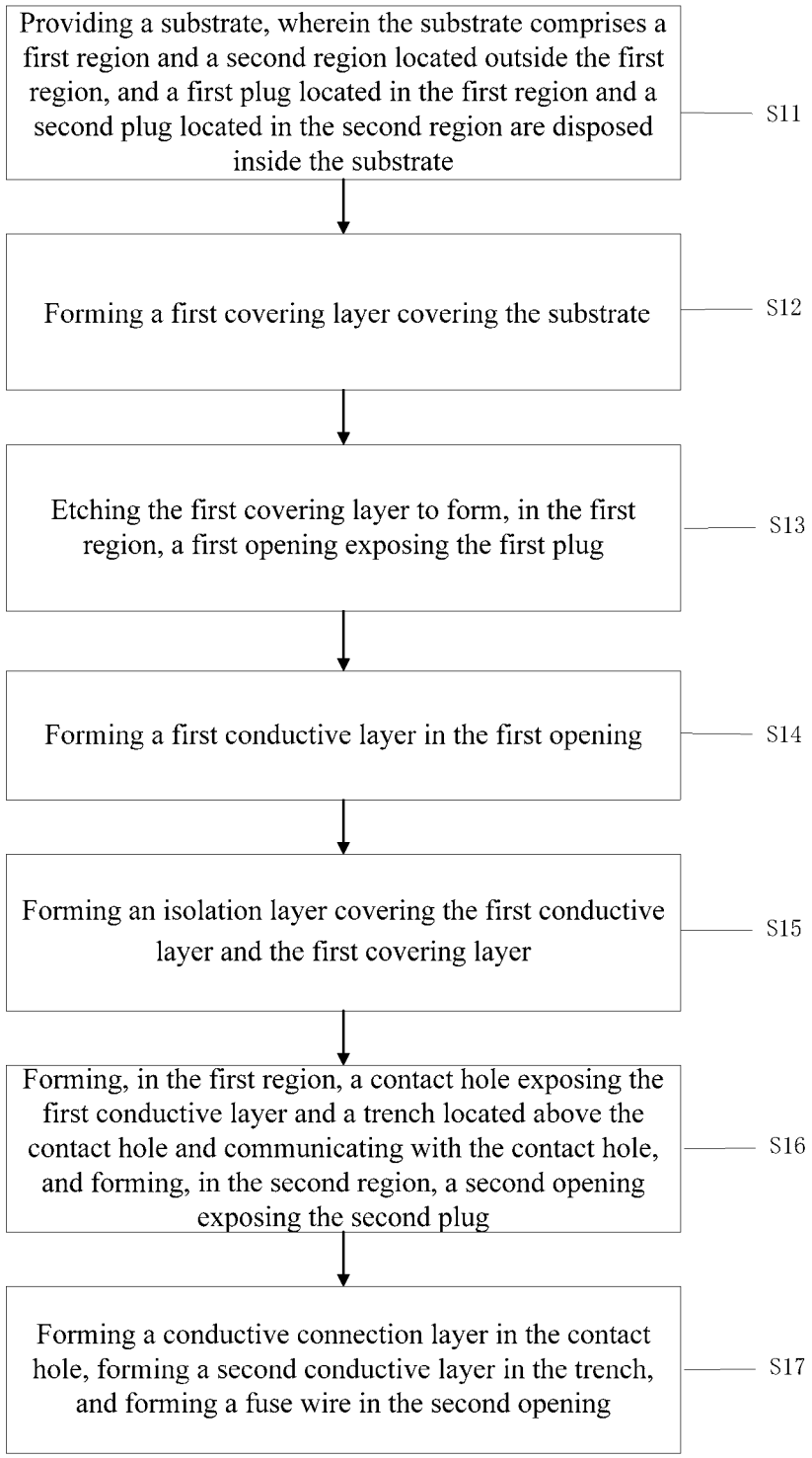
FIG. 1 is a flowchart of a formation method of an integrated circuit device in a specific embodiment of the this application.
Figure 2A:
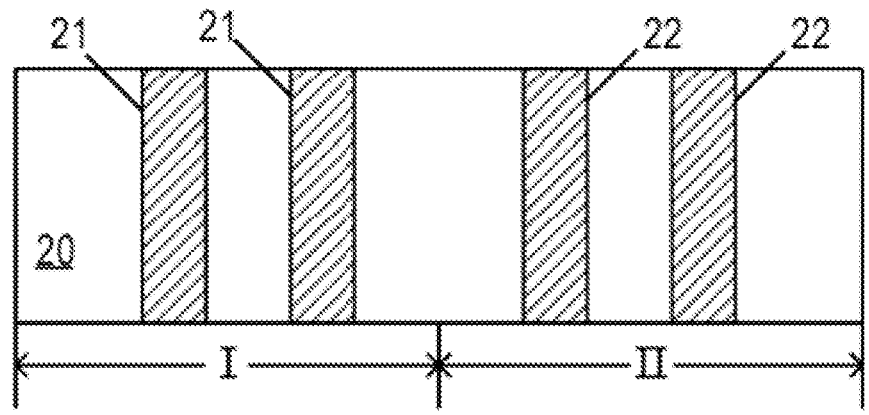
FIGS. 2A-2J are schematic cross-sectional views of main processes in a process of forming an integrated circuit device in a specific embodiment of the this application.

This specific embodiment provides a formation method of an integrated circuit device. FIG. 1 is a flowchart of a formation method of an integrated circuit device in a specific embodiment of this application, and FIGS. 2A-2J are schematic cross-sectional views of main processes in a process of forming an integrated circuit device in a specific embodiment of this application. As shown in FIGS. 1, 2A and 2I, the formation method of an integrated circuit device provided in this specific embodiment includes the following steps.

In step S11, a substrate 20 is provided; the substrate 20 includes a first region I and a second region II located outside the first region I, and a first plug 21 located in the first region I and a second plug 22 located in the second region II are disposed inside the substrate 20, as shown in FIG. 2A.

The substrate 20 may be of a single-layer structure or of a multi-layer structure composed of a plurality of semiconductor layers. The "multi-layer" mentioned in this specific embodiment refers to two layers and more than two layers. A specific material of the substrate 20 can be selected by those skilled in the art according to actual needs. This specific embodiment is described by taking an example in which the material of the substrate 20 is an oxide material (such as silicon dioxide).

An upper part of the first region I of the substrate 20 is configured to form a double-layer Damascus structure, and is electrically connected to an external pad;

An upper part of the second region II of the substrate 20 is configured to form a fuse wire, and the fuse wire can be blown to achieve the purpose of adjusting the electrical performance or electrical parameters of the integrated circuit device.

A specific method for forming the first plug 21 and the second plug 22 in the substrate 20 may be as follows: the substrate 20 is etched first, a first through hole is formed in the first region I and a second through hole is formed in the second region II; then, a conductive material, such as metal tungsten or doped polysilicon, is used to fill the first through hole and the second through hole, and the first plug 21 and the second plug 22 are also formed in this process; finally, a chemical mechanical polishing process (CMP) can be carried out for planarization, so that a top surface of the first plug 21 and a top surface of the second plug 22 are flush with a top surface of the substrate 20.

Figure 2B:
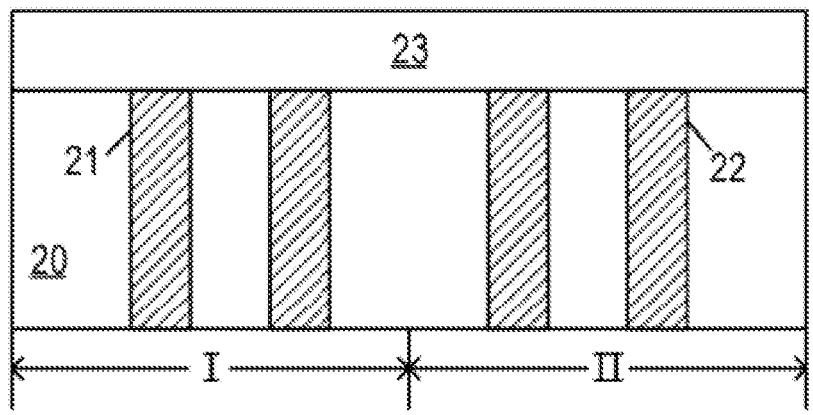

In step S12, a first covering layer 23 covering the substrate 20 is formed, as shown in FIG. 2B After the first plug 21 and the second plug 22 are planarized, the first covering layer 23 may be deposited by a chemical vapor deposition process, a physical vapor deposition process, or an atomic layer deposition process so that the first covering layer 23 covers the top surface of the first plug 21, the top surface of the second plug 22, and the top surface of the substrate 20. A material of the first covering layer 23 is an insulating material, the specific type of which can be selected by those skilled in the art according to actual needs. A thickness of the first covering layer 23 can be set according to a thickness of a first conductive layer to be formed subsequently.

Figure 2C:
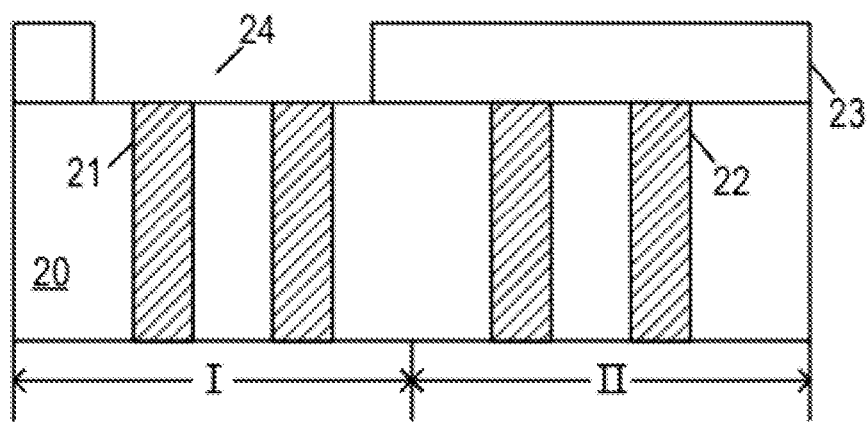

In step S13, the first covering layer 23 is etched, and a first opening 24 exposing the first plug 21 is formed in the first region I, as shown in FIG. 2C.

The material of the first covering layer 23 is an insulating material. By etching the first covering layer 23 above the first region I of the substrate 20 and using the first plug 21 as an etch stop layer, the first opening 24 penetrating the first covering layer 23 and exposing the first plug 21 in the substrate 20 is formed.

In this etching process, the first covering layer 23 above the second region II of the substrate 20 is not etched, on the one hand, it is ensured that a fuse wire formed subsequently does not have a first conductive layer structure or residues of the material of the first conductive layer; on the other hand, since only the first covering layer 23 above the first region I is etched, the alignment difficulty can be reduced, thereby simplifying the etching process. An inner diameter of the first opening 24 can be set by those skilled in the art according to a specific structure of the first conductive layer to be formed.

Figure 2D:
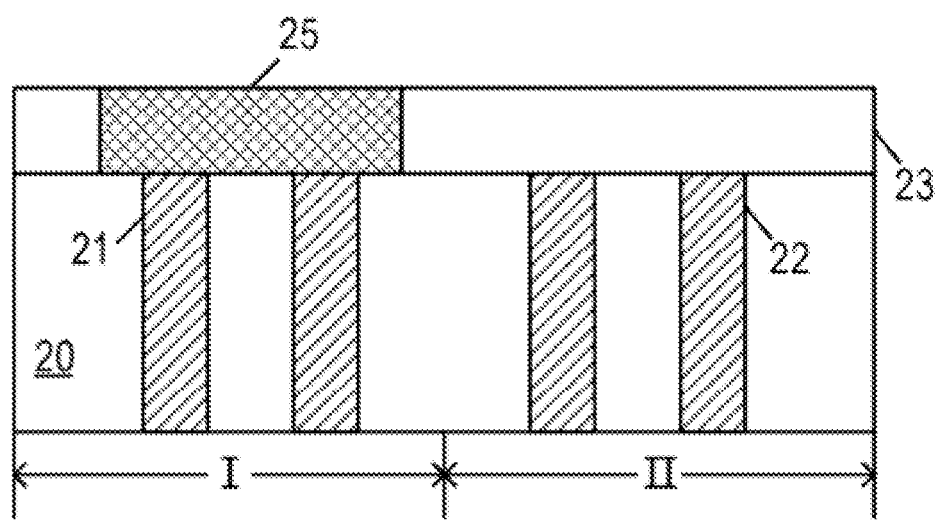

In step 14, a first conductive layer 25 is formed in the first opening 24, as shown in FIG. 2D.

The first opening 24 is filled with a conductive material such as metal copper to form the first conductive layer 25. Then, a chemical mechanical polishing process is used to planarize the first conductive layer 25, so that a top surface of the first conductive layer 25 (i.e., a surface of the first conductive layer 25 away from the substrate 20) is flush with the top surface of the first covering layer 23 (i.e., a surface of the first covering layer 23 away from the substrate 20).

Figure 2E:
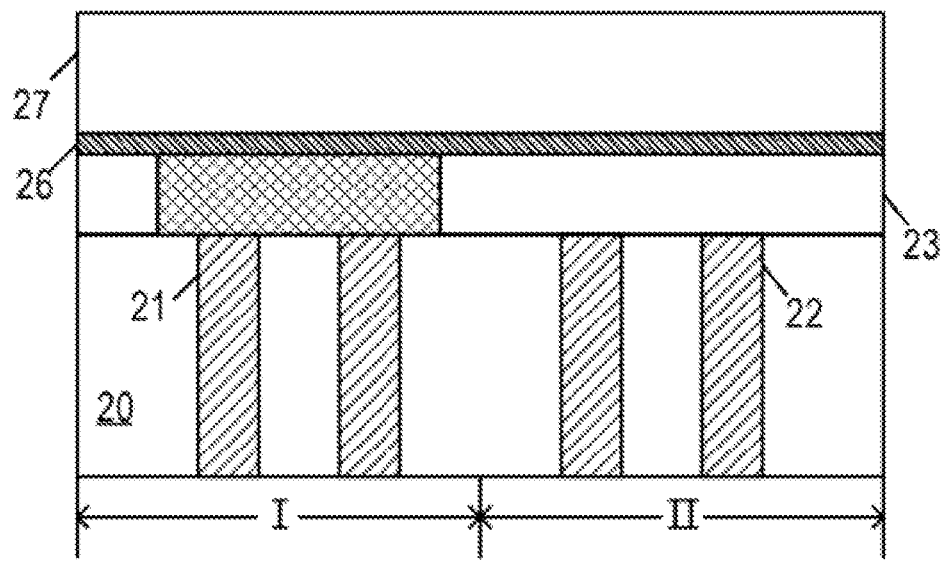
Figure 2F:
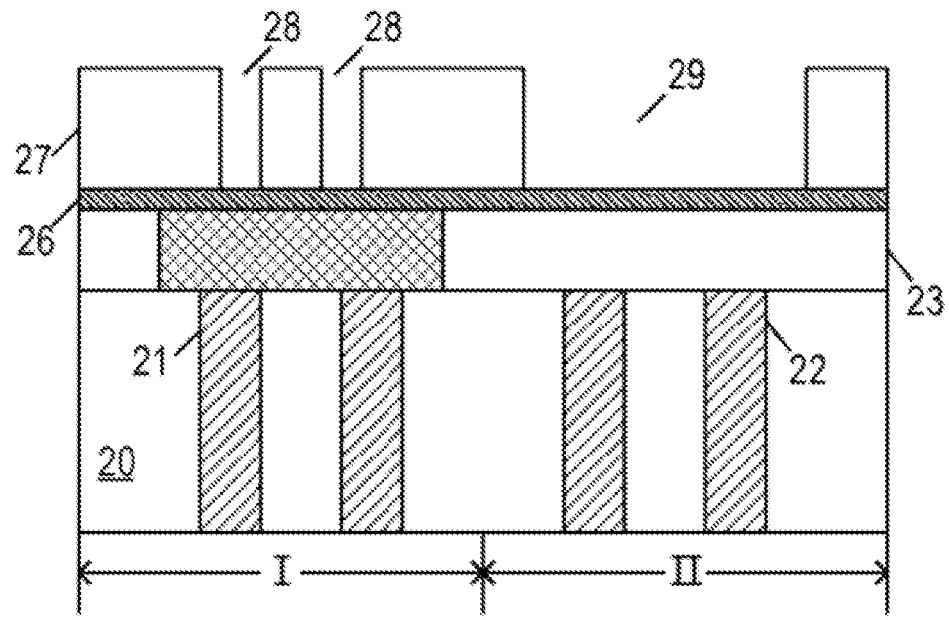

In step S15, an isolation layer covering the first conductive layer 25 and the first covering layer 23 is formed, as shown in FIG. 2E.

The isolation layer may be of a single-layer structure or a multi-layer structure, and those skilled in the art can make a selection according to actual needs. In order to ensure a shape of the contact hole to be formed later, in this specific embodiment, the implementation that an isolation layer covering the first conductive layer 25 and the first covering layer 23 is formed includes the following specific steps:

forming a first subisolation layer 26 covering the first conductive layer 25 and the first covering layer 23; and forming a second subisolation layer 27 covering the first subisolation layer 26, wherein the first subisolation layer 26 and the second subisolation layer 27 together constitute an isolation layer.

First, the first subisolation layer 26 covering the top surface of the first conductive layer 25 and the top surface of the first covering layer 23 is formed; and then the second subisolation layer 27 covering the first subisolation layer 26 is formed. By forming the first subisolation layer 26 and the second subisolation layer 27 stacked one another and by selecting a suitable material, a certain etch selectivity ratio is formed between the first subisolation layer 26 and the second subisolation layer 27 (e.g., the etch selectivity ratio is greater than 3), and shapes of the contact hole, the trench and the second opening to be formed subsequently can be controlled by selective etching. In this specific embodiment, the first subisolation layer 26 may be of a single-layer structure and made of a nitride material, such as silicon nitride; the first subisolation layer 26 may also be of a multi-layer SIN/SICN/SION structure. The second subisolation layer 27 may be made of an oxide material, such as silicon dioxide.

Figure 2G:
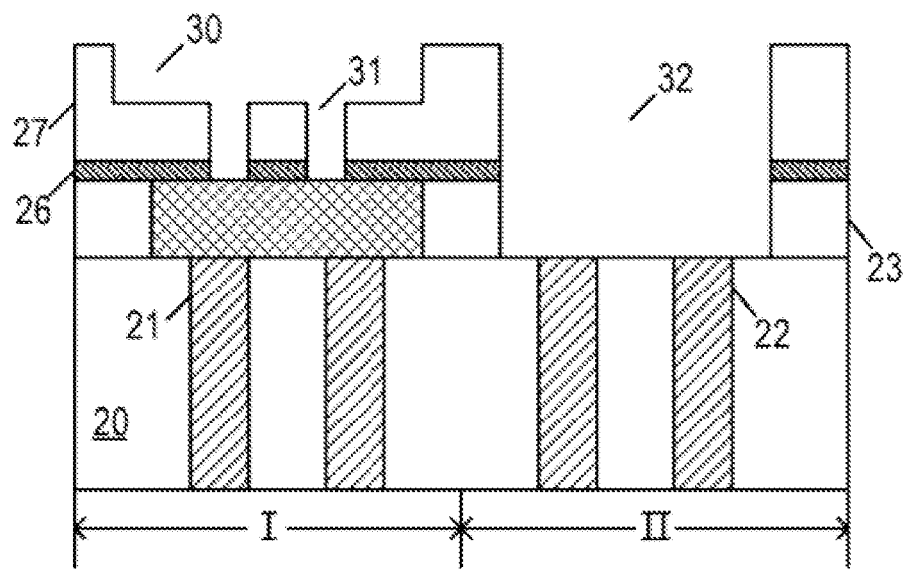
Figure 2H:
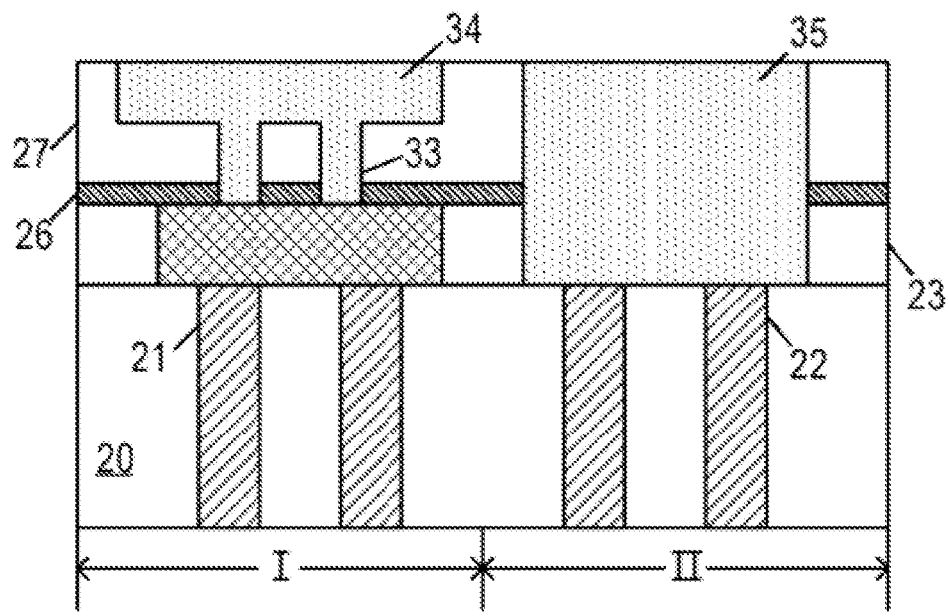
Figure 2I:
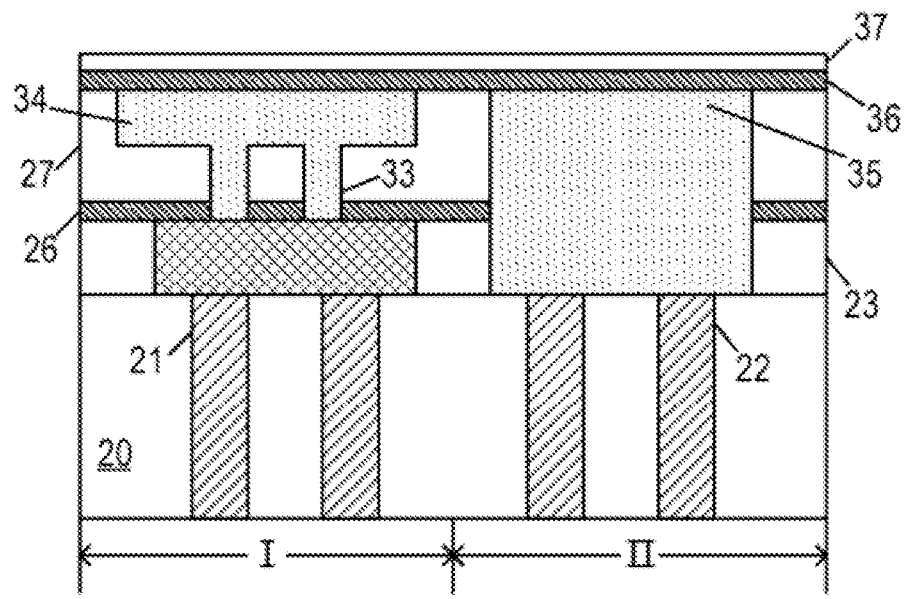

In step S16, a contact hole 31 exposing the first conductive layer 25 and a trench 30 located above the contact hole 31 and connecting with the contact hole 31 are formed in the first region I, and a second opening 32 exposing the second plug 22 is formed in the second region II, as shown in FIG. 2G.

In an alternative embodiment, the implementation that a contact hole 31 exposing the first conductive layer 25 and a trench 30 located above the contact hole 31 and connecting with the contact hole 31 are formed in the first region I, and a second opening 32 exposing the second plug 22 is formed in the second region II includes the following specific steps:

etching the second subisolation layer 27 located in the first region I and the second region II, to form, in the first region, an initial contact hole 28 exposing the first subisolation layer 26, and form, in the second region II, an initial second opening 29 penetrating the second subisolation layer 27, as shown in FIG. 2F; and etching the second subisolation layer 27 on a sidewall of the initial contact hole 28 and the first subisolation layer 26 at a bottom of the initial contact hole 28 and etching the first subisolation layer 26 and the first covering layer 23 at a bottom of the initial second opening 29, to form, in the first region I, a contact hole 31 exposing the first conductive layer 25 and a trench 30 located above the contact hole 31 and connecting with the contact hole 31, and form, in the second region II, a second opening 32 exposing the second plug 22, as shown in FIG. 2G.

In order to simplify the etching step, in an alternative embodiment, the second subisolation layer 27 and the first covering layer 23 are made of the same material.

After the first subisolation layer 26 and the second subisolation layer 27 are formed, first using the first subisolation layer 26 as an etch stop layer, the second subisolation layer 27 is etched to form, in the first region I and at a position corresponding to the first conductive layer 25, the initial contact hole 28 penetrating the second subisolation layer 27, and form, in the second region II and at a position corresponding to the second plug 22, the initial second opening 29 penetrating the second subisolation layer 27. Next, the first subisolation layer 26 at the bottom of the initial contact hole 28 is etched along the initial contact hole 28 to expose the first conductive layer 25, and at the same time, the first subisolation layer 26 is etched along the initial second opening 29 to expose the first covering layer 23 on the second region II. A sidewall at an upper part of the initial contact hole 28 is etched to increase an opening size of the upper part of the initial contact hole 28, and the upper parts of the plurality of initial contact holes 28 connect with each other to form the trench 30 having an inner diameter larger than an inner diameter of one of the initial contact holes 28. In other specific embodiments, only an opening width of the upper part of the initial contact hole 28 may be increased, without connecting the adjacent initial contact holes 28. Then, the first covering layer 23 is further etched along the initial second opening 29 to expose the second plug 23. In this specific embodiment, the material of the second subisolation layer 27 is set to be the same as the material of the first covering layer 23, so that during the process of forming the trench 30 by etching, the first covering layer 23 is etched to form the second opening 32, which can reduce the etching step, lower the etching cost, and improve the etching efficiency.

Figure 3A:
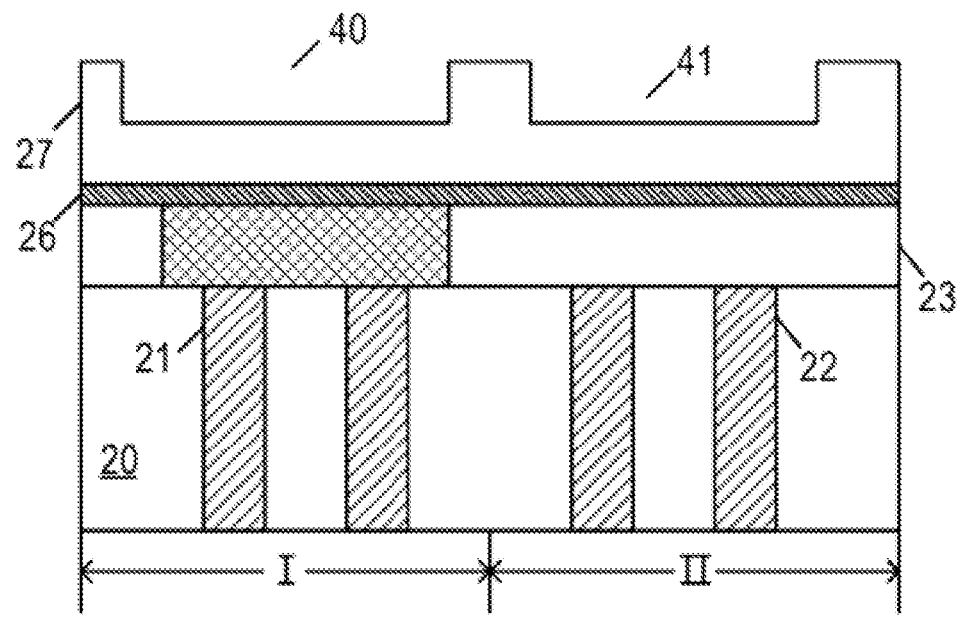
FIGS. 3A-3B are schematic cross-sectional views of main processes in a process of forming an integrated circuit device in another embodiment of this application.
Figure 3B:
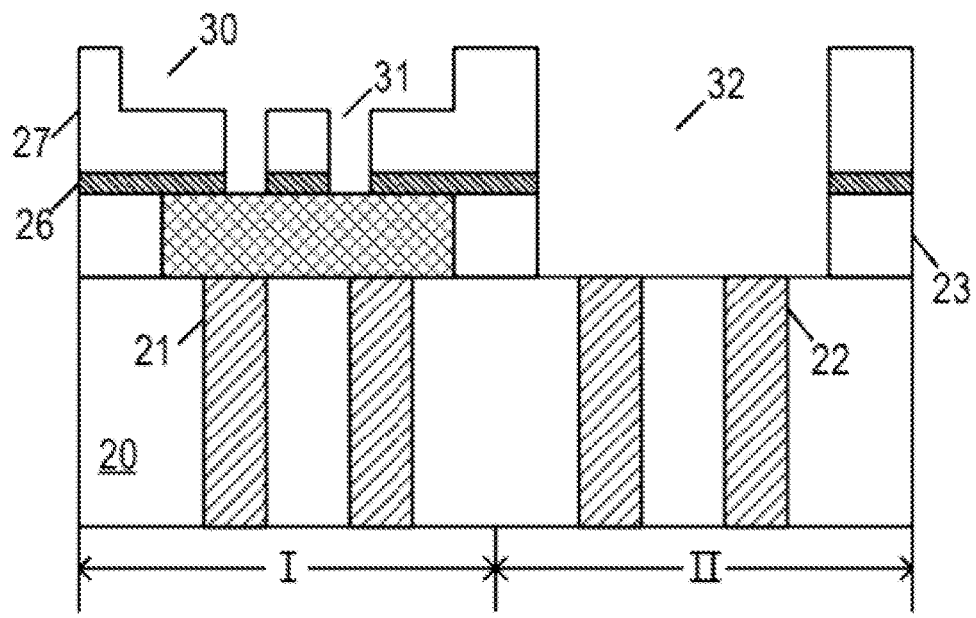

This specific embodiment is described by taking an example in which in the double-layer Damascus structure, the contact hole 31 is formed first and then the trench is formed. In other specific embodiments, the trench in the double-layer Damascus structure can be formed first, and then the contact hole for connecting two adjacent conductive layers is formed. FIGS. 3A-3B are schematic cross-sectional views of main processes in a process of forming an integrated circuit device in another embodiment of this application. As shown in FIGS. 3A-3B, in other specific embodiments, the implementation that a contact hole 31 exposing the first conductive layer 25 and a trench 30 located above the contact hole 31 and connecting with the contact hole 31 are formed in the first region I, and a second opening 32 exposing the second plug 22 is formed in the second region II includes the following specific steps:

etching the second subisolation layer 27 located in the first region I and the second region II, to form in the first region I, an initial trench 40 not penetrating the second subisolation layer 27, and form, in the second region II, a window 41 not penetrating the second subisolation layer 27; and etching the second subisolation layer 27 and the first subisolation layer 28 at a bottom of the initial trench 40 and etching the second subisolation layer 27, the first subisolation layer 26 and the first covering layer 23 at a bottom of the window 41, to form, in the first region I, a contact hole 31 exposing the first conductive layer 25 and a trench 30 located above the contact hole 31 and connecting with the contact hole 31, and form, in the second region II, a second opening 32 exposing the second plug 22, as shown in 3B.

In step S17, a conductive connection layer 33 is formed in the contact hole 1, a second conductive layer 34 is formed in the trench 30, and a fuse wire 35 is formed in the second opening 30.

In an alternative embodiment, the implementation that a conductive connection layer 33 is formed in the contact hole 1, a second conductive layer 34 is formed in the trench 30, and a fuse wire 35 is formed in the second opening 30 includes the following specific step:

filling the contact hole 31, the trench 30, and the second opening 32 with a conductive material, to form a conductive connection layer 33 in the contact hole 31, form a second conductive layer 34 in the trench 30, and form a fuse wire 35 in the second opening 32.

The materials of the conductive connection layer 33, the second conductive layer 34, and the fuse wire 35 may all be the same as the material of the first conductive layer 25, for example, all are a metallic copper material. Those skilled in the art can also set the materials of the conductive connection layer 33, the second conductive layer 34, the fuse wire 35 and the first conductive layer 25 to be different according to actual needs. A cross-sectional shape of the fuse wire 35 may be circular or rectangular with rounded corners.

In an alternative embodiment, the formation method of an integrated circuit device further includes the following step:

forming a second covering layer covering the second conductive layer 34, the fuse wire 35, and the isolation layer.

The second covering layer may be of a single-layer structure or of a multi-layer structure. In this specific embodiment, the second covering layer of a multi-layer structure is set forth as an example for description. As shown in FIG. 2I, the second covering layer includes a first protective layer 36 and a second protective layer 37. The first protective layer 36 may be of a single-layer structure and made of a nitride material, such as silicon nitride; the first protective layer 36 may also be of a multi-layer SIN/SICN/SION structure. The second protective layer 37 may be made of an oxide material, such as silicon dioxide.

Figure 2J:
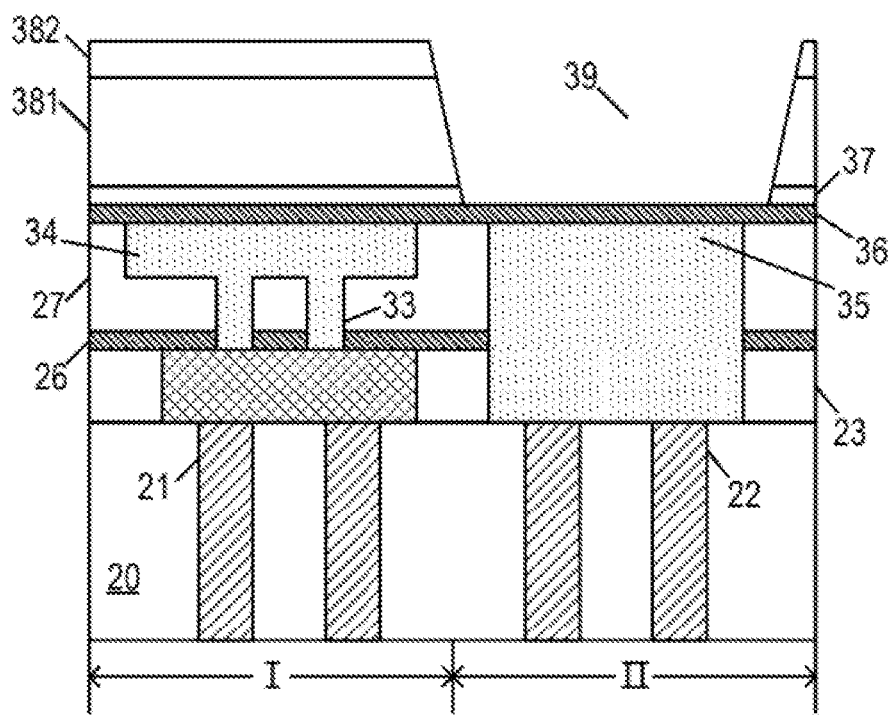

After the formation of the second covering layer including the first protective layer 36 and the second protective layer 37, a third covering layer 381 and a fourth covering layer 382 may be sequentially formed on the second covering layer; and the fourth covering layer 382, the third covering layer 381, and the second protective layer 37 in the second region II are etched to form a third opening 39 penetrating the fourth covering layer 382, the third covering layer 381, and the second protective layer 37 and exposing the first protective layer 36, as shown in FIG. 2J.

Subsequently, the fuse wire 35 can be blown through the third opening 39. The third covering layer 381 is of a single-layer structure (made of a hard mask material, such as silicon nitride or silicon oxynitride), or of a multi-layer structure. The fourth covering layer 382 may also be of a single-layer structure (made of an organic mask material, such as amorphous carbon), or of a multi-layer structure.

In addition, this specific embodiment further provides an integrated circuit device. The integrated circuit device provided by this specific embodiment can be formed by the method shown in FIG. 1, FIG. 2A to FIG. 2J or FIG. 3A to FIG. 3B. For a specific structure of the integrated circuit device, reference can be made to FIG. 2I and FIG. 2J. As shown in FIG. 2I and FIG. 2J, the integrated circuit device provided in this specific embodiment includes:

a substrate 20, including a first region I and a second region II located outside the first region I, wherein a first plug 21 located in the first region I and a second plug 22 located in the second region II are disposed inside the substrate 20, and a surface of the substrate 20 is provided with a first covering layer 23 and an isolation layer on a surface of the first covering layer 23; a first conductive layer 25 located in the first covering layer 23 in the first region I and electrically connected to the first plug 21;

a conductive connection layer 33 located on a surface of the first conductive layer 25;

a second conductive layer 34 located on a surface of the conductive connection layer 23, wherein one end of the conductive connection layer 33 is electrically connected to the first conductive layer 25, and the other end of the conductive connection layer 33 is electrically connected to the second conductive layer 34; and a fuse wire 35, located in the second region II, wherein the fuse wire 35 is of a solid columnar structure and penetrates the isolation layer and the first covering layer 23, a bottom surface of the fuse wire 35 is electrically connected to the second plug 22, and a top surface of the fuse wire 35 is flush with a top surface of the second conductive layer 34.

In an alternative embodiment, the fuse wire 35, the second conductive layer 34 and the conductive connection layer 33 are made of the same material.

In an alternative embodiment, the isolation layer includes:

a first subisolation layer 26, covering the surface of the first covering layer 23; and a second subisolation layer 27, covering a surface of the first subisolation layer, wherein a thickness of the second subisolation layer 27 is greater than that of the first subisolation layer 26.

In an alternative embodiment, the second subisolation layer 27 and the first covering layer 23 are made of the same material.

In an alternative embodiment, the integrated circuit device further includes:

a second covering layer, covering the surfaces of the second conductive layer 34, the fuse wire 35, and the isolation layer.

In the integrated circuit device and the formation method thereof provided by this specific embodiment of this application, the second region for forming the fuse wire is not processed during the process of forming the first conductive layer, and the fuse wire is also formed during the process of forming the conductive connection layer and the second conductive layer so that the formed fuse wire is of a simple solid columnar structure, which has nothing to do with structures of the first conductive layer and the second conductive layer. In this way, the structure of the fuse wire is simplified so that the fuse wire can be blown only by a low energy; moreover, the entire production process of the integrated circuit device is simplified, the production process cost of the integrated circuit device is reduced, and the yield of integrated circuit devices is also improved.

It should be understood that the above-mentioned specific embodiments of the present invention are only used to exemplarily illustrate or explain the principle of the present invention, and do not constitute a limitation to the present invention. Therefore, any modification, equivalent replacement, improvement, and the like made without departing from the spirit and scope of the present invention should be included in the protection scope of the present invention. In addition, the appended claims of the present invention are intended to cover all changes and modifications that fall within the scope and boundary of the appended claims, or equivalent forms of such scope and boundary.

What is claimed is:

1. A formation method of an integrated circuit device, comprising the following steps:

providing a substrate, wherein the substrate comprises a first region and a second region located outside the first region, and a first plug located in the first region and a second plug located in the second region are disposed inside the substrate;

forming a first covering layer covering the substrate;

etching the first covering layer to form, in the first region, a first opening exposing the first plug;

forming a first conductive layer in the first opening;

forming an isolation layer covering the first conductive layer and the first covering layer;

forming, in the first region, a contact hole exposing the first conductive layer and a trench located above the contact hole and connecting with the contact hole, and forming, in the second region, a second opening exposing the second plug; and forming a conductive connection layer in the contact hole, forming a second conductive layer in the trench, and forming a fuse wire in the second opening.

2. The formation method of an integrated circuit device according to claim 1, wherein the forming an isolation layer covering the first conductive layer and the first covering layer comprises the following specific steps;

forming a first subisolation layer covering the first conductive layer and the first covering layer; and forming a second subisolation layer covering the first subisolation layer, wherein the first subisolation layer and the second subisolation layer together constitute an isolation layer.

3. The formation method of an integrated circuit device according to claim 2, wherein the forming, in the first region, a contact hole exposing the first conductive layer and a trench located above the contact hole and connecting with the contact hole, and forming, in the second region, a second opening exposing the second plug comprise the following specific steps:

etching the second subisolation layer located in the first region and the second region, to form, in the first region, an initial contact hole exposing the first subisolation layer, and form, in the second region, an initial second opening penetrating the second subisolation layer; and etching the second subisolation layer on a sidewall of the initial contact hole and the first subisolation layer at a bottom of the initial contact hole and etching the first subisolation layer and the first covering layer at a bottom of the initial second opening, to form, in the first region, a contact hole exposing the first conductive layer and a trench located above the contact hole and connecting with the contact hole, and form, in the second region, a second opening exposing the second plug.

4. The formation method of an integrated circuit device according to claim 2, wherein the forming, in the first region, a contact hole exposing the first conductive layer and a trench located above the contact hole and connecting with the contact hole, and forming, in the second region, a second opening exposing the second plug comprise the following specific steps:
- etching the second subisolation layer located in the first region and the second region, to form, in the first region, an initial trench not penetrating the second subisolation layer, and form, in the second region, a window not penetrating the second subisolation layer;
- etching the second subisolation layer and the first subisolation layer at a bottom of the initial trench and etching the second subisolation layer, the first subisolation layer and the first covering layer at a bottom of the window, to
- form, in the first region, a contact hole exposing the first conductive layer and a trench located above the contact hole and connecting with the contact hole, and form, in the second region, a second opening exposing the second plug.

5. The formation method of an integrated circuit device according to claim 2, wherein the second subisolation layer and the first covering layer are made of the same material.

6. The formation method of an integrated circuit device according to claim 1, wherein the forming a conductive connection layer in the contact hole, forming a second conductive layer in the trench, and forming a fuse wire in the second opening comprise the following specific step:
- filling the contact hole, the trench, and the second opening with a conductive material, to form a conductive connection layer in the contact hole, form a second conductive layer in the trench, and form a fuse wire in the second opening.

7. The formation method of an integrated circuit device according to claim 1, further comprising the following step:
- forming a second covering layer covering the second conductive layer, the fuse wire, and the isolation layer.

8. The formation method of an integrated circuit device according to claim 7, wherein the second covering layer comprises:
- a first protective layer, covering the surfaces of the second conductive layer, the fuse wire, and the isolation layer; and
- a second protective layer, covering a surface of the first protective layer.

9. The formation method of an integrated circuit device according to claim 8, wherein a third covering layer and a fourth covering layer are sequentially formed on the second covering layer; and
- etching the fourth covering layer, the third covering layer, and the second protective layer in the second region II, to form a third opening penetrating the fourth covering layer, the third covering layer, and the second protective layer and exposing the first protective layer.

10. An integrated circuit device, comprising:
- a substrate, wherein the substrate comprises a first region and a second region located outside the first region, wherein a first plug located in the first region and a second plug located in the second region are disposed inside the substrate, and a surface of the substrate is provided with a first covering layer and an isolation layer on a surface of the first covering layer;
- a first conductive layer located in the first covering layer in the first region and electrically connected to the first plug;
- a conductive connection layer located on a surface of the first conductive layer;
- a second conductive layer located on a surface of the conductive connection layer, wherein one end of the conductive connection layer is electrically connected to the first conductive layer, and the other end of the conductive connection layer is electrically connected to the second conductive layer; and
- a fuse wire, located in the second region, wherein the fuse wire is of a solid columnar structure and penetrates the isolation layer and the first covering layer, a bottom surface of the fuse wire is electrically connected to the second plug, and a top surface of the fuse wire is flush with a top surface of the second conductive layer.

11. The integrated circuit device according to claim 10, wherein the fuse wire, the second conductive layer and the conductive connection layer are made of the same material.

12. The integrated circuit device according to claim 10, wherein the isolation layer comprises:
- a first subisolation layer, covering the surface of the first covering layer;
- a second subisolation layer, covering a surface of the first subisolation layer, wherein a thickness of the second subisolation layer is greater than that of the first subisolation layer.

13. The integrated circuit device according to claim 12, wherein the second subisolation layer and the first covering layer are made of the same material.

14. The integrated circuit device according to claim 10, further comprising:
- a second covering layer, covering the surfaces of the second conductive layer, the fuse wire and the isolation layer.

* * * * *